Figure 1:
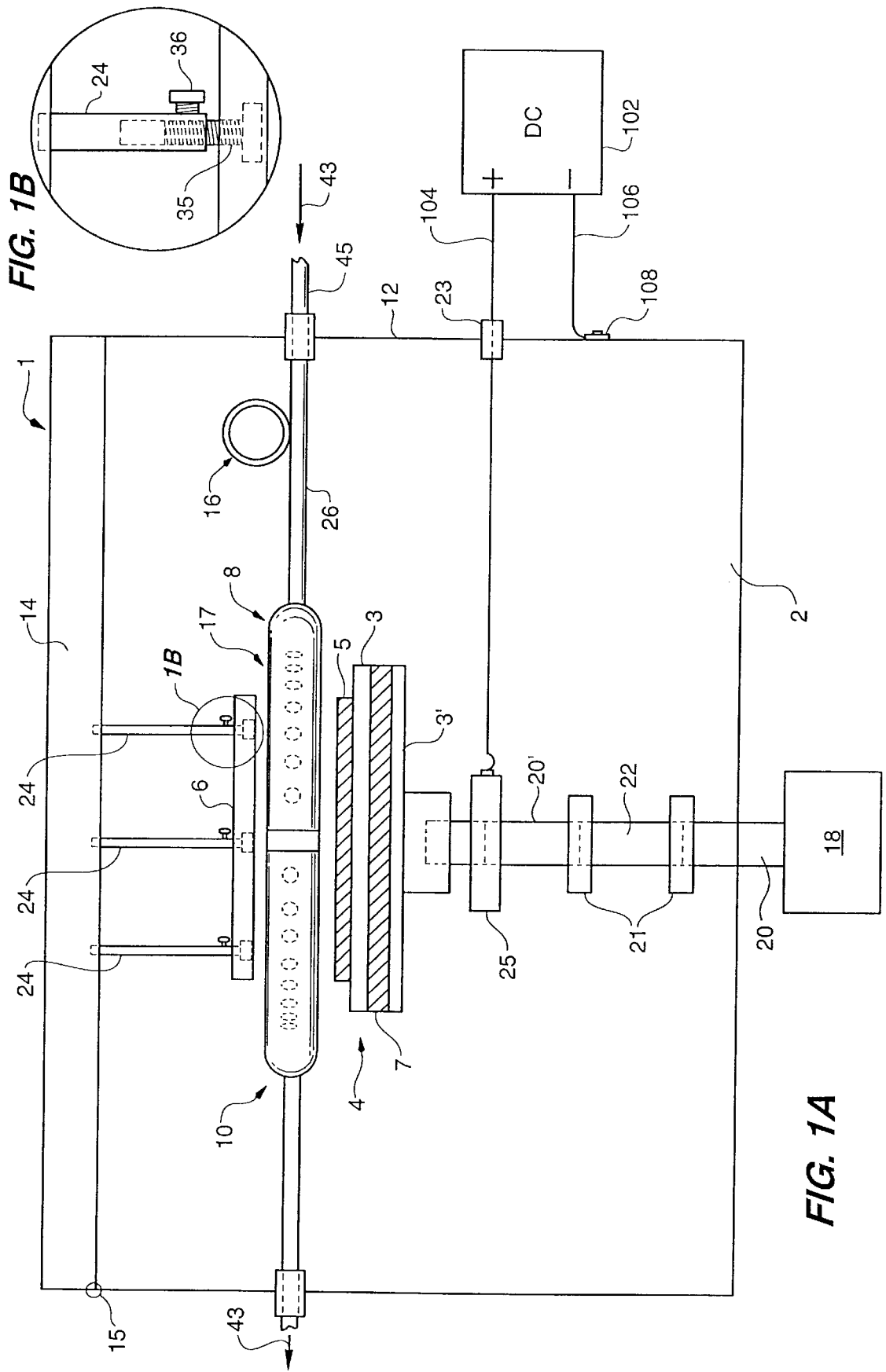

United States Patent
Hayashi et al.

[11] Patent Number: 6,143,063
[45] Date of Patent: Nov. 7, 2000

[54] MISTED PRECURSOR DEPOSITION APPARATUS AND METHOD WITH IMPROVED MIST AND MIST FLOW

[75] Inventors: Shinichiro Hayashi, Osaka, Japan; Larry D. McMillan; Carlos A. Paz de Araujo, both of Colorado Springs, Colo.

[73] Assignees: Symetrix Corporation, Colorado Springs, Colo.; Matsushita Electronics Corporation, Japan

[21] Appl. No.: 09/128,058

[22] Filed: Aug. 3, 1998

Related U.S. Application Data

[63] Continuation-in-part of application No. 08/610,330, Mar. 4, 1996, Pat. No. 5,962,085.

[51] Int. Cl.[7] .................................................... C09D 5/00
[52] U.S. Cl. ................................ 106/287.18; 106/287.19
[58] Field of Search ........................... 106/287.18, 287.19

[56] References Cited

U.S. PATENT DOCUMENTS

| 5,456,945 | 10/1995 | McMillan et al. ....................... 427/252 |
| 5,688,565 | 11/1997 | McMillan et al. . |
| 5,849,071 | 12/1998 | Derbenwick et al. ............. 106/287.11 |

FOREIGN PATENT DOCUMENTS

WO98/11603   3/1998   WIPO .

*Primary Examiner*—David Brunsman
*Attorney, Agent, or Firm*—Duft, Graziano & Forest, P.C.

[57] ABSTRACT

A substrate is located within a deposition chamber, the substrate defining a substrate plane. A liquid precursor is misted by ultrasonic or venturi apparatus, to produce a colloidal mist. The mist is generated, allowed to settle in a buffer chamber, filtered through a system up to 0.01 micron, and flowed into the deposition chamber between the substrate and barrier plate to deposit a liquid layer on the substrate. The liquid is dried to form a thin film of solid material on the substrate, which is then incorporated into an electrical component of an integrated circuit.

10 Claims, 8 Drawing Sheets

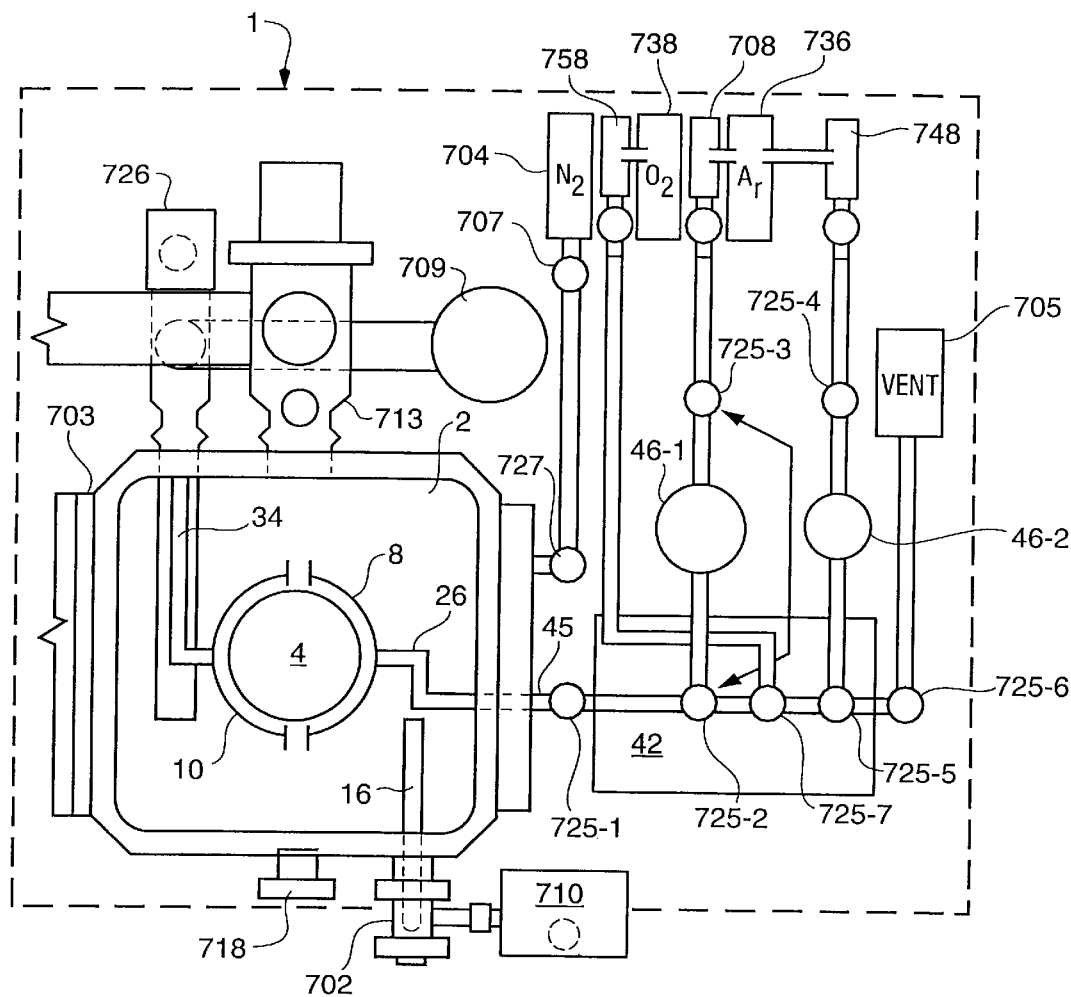
FIG. 7
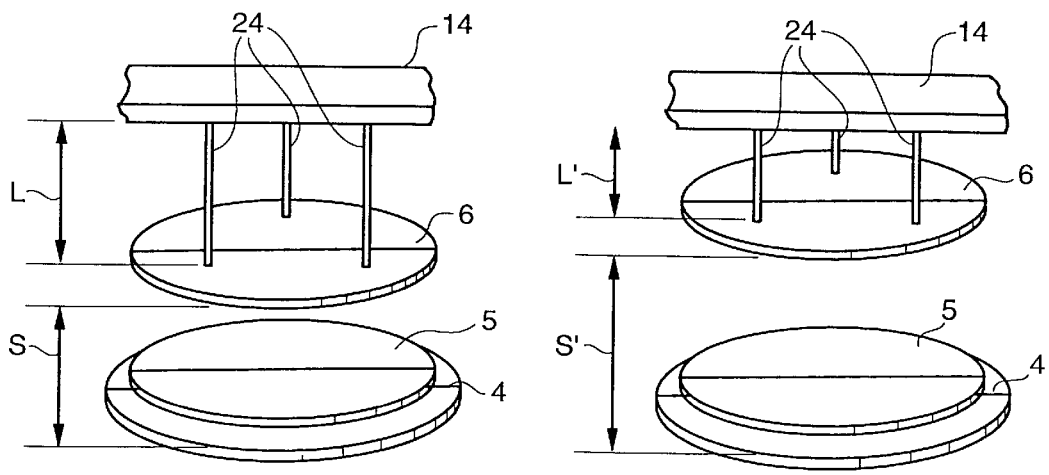
FIG. 8               FIG. 9

MISTED PRECURSOR DEPOSITION APPARATUS AND METHOD WITH IMPROVED MIST AND MIST FLOW

RELATED APPLICATIONS

This application is a continuation-in-part of application Ser. No. 08/610,330 filed Mar. 4, 1996, now U.S. Pat. No. 5,962,085, Oct. 5, 1999.

BACKGROUND OF THE INVENTION

1. Field of the Invention

The invention relates to materials and methods for fabricating thin film electrical components in integrated circuits and, more particularly, liquid precursor solutions which are used in misted deposition apparatus for depositing thin films.

2. Description of the Related Art

As is well-known in the art, the electrical components in integrated circuits are made up of layers of thin films which are connected by wiring layers and separated by insulating layers. Simple thin film materials and compounds, such as silicon glass, have been formed using a liquid deposition process. Complex compounds, i.e., compounds containing more than two elements, in the prior art have always been formed using processes such as vacuum sputtering (i.e., E-beam, D.C., R.F., ion-beam, etc.), laser ablation, reactive chemical vapor deposition including metalorganic chemical vapor deposition (MOCVD); and liquid application methods using sol-gels (alkoxides) or carboxylates. However, none of these known methods have been able to produce metal oxides with properties that are entirely satisfactory for use in integrated circuits. In all of the prior art processes, except sputtering, the films produced had significant physical defects, such as cracking, peeling, etc.

It was substantially impossible with the conventional processes, particularly sputtering, to reliably and repeatably produce metal oxides with a specific stoichiometry within tolerances required for integrated circuits. Some processes, like MOCVD, could be dangerous or toxic. Most required high temperatures that were destructive to an integrated circuit, and provided poor "step coverage" of a substrate to be covered, e.g., the prior art techniques resulted in a relatively excessive build-up of deposition of the film at the boundary of any discontinuities on the substrate. In prior art liquid deposition processes, it was impossible to control thickness with the degree of accuracy that is required to manufacture integrated circuits. As a result, up to now, metal oxides and other complex materials have not been used in integrated circuits except for one or two specialty, relatively expensive applications, such as the use of sputtered lead zirconium titanate (PZT) in ferroelectric integrated circuits that were expected to have short life times.

U.S. Pat. No. 5,456,945 to McMillan et al. provided a substantial advance in the art by teaching the use of ultrasonic transducers to generate a volume of mist or aerosol into a deposition chamber. Within the deposition chamber, a DC voltage is applied between a substrate holder and a barrier plate for induced polarization in the aerosol particles. A constant flow of carrier gas, e.g., argon, is used to transport the aerosol to an integrated circuit substrate or wafer for the deposition of liquid thin films. These liquid thin films are dried and annealed to yield the thin films of an integrated circuit.

When the precursor is processed in misted deposition apparatus according to the No. 5,456,945 patent, the selection or choice of a liquid precursor affects step coverage, liquid film deposition rate, and the final thin film morphology. The use of some liquid precursor solutions results in no material being deposited as desired. Other solutions provide poor step coverage, and yet other solutions have good step coverage with poor film morphology. There is a need for liquid precursor solutions that function in misted deposition apparatus to provide good step coverage and good film morphology. There is also a need for parameters permitting the design and development of precursor solutions that will function appropriately in misted deposition apparatus.

SUMMARY OF THE INVENTION

The claimed invention overcomes the problems outlined above to advance the art by providing a cosolvent system for use in liquid precursor solutions for misted deposition apparatus. The liquid precursors are processed in misted deposition apparatus to yield metal oxide thin films having good step coverage and good film morphology rendering the metal oxide thin films suitable for use in integrated circuits. Additionally, the cosolvent system enhances the film deposition rate.

Method and apparatus according to the invention utilize a liquid precursor solution to form metal compounds. The solution is processed in a misted deposition apparatus to yield films having good step coverage and good morphology. The liquid precursor comprises a metal organic portion including at least one metal organic compound. The metal organic portion has a total metal content in an effective amount for yielding a solid metal compound during an anneal of a thin film of the liquid precursor solution. For example, the metal organic portion may contain barium, strontium, and titanium metals to yield barium strontium titanate (BST) in an oxygen anneal. The resultant BST has a stoichiometry corresponding to that of the liquid precursor solution for these metals less any volatilization losses of metals during the anneal.

The metal organic portion is mixed with a cosolvent system. The cosolvent system includes a first solvent for use in solubilizing said metal organic portion and a thinning agent for use in reducing surface tension in the liquid precursor solution to a value ranging from 10 to 40 dynes per centimeter. This range of surface tension is more preferably from 14 to 34, and is most preferably from 16 to 26. These surface tensions are measured at the ambient temperature in the intended environment of use. The thinning agent is selected from the group consisting of organic compounds having a viscosity less than 0.7 centipoise at 20° C., and a specific gravity greater than 0.7 at 20° C. This ambient temperature is preferably about 20° C. The metal organic portion, the first solvent, and the thinning agent form a substantially homogenous mixture.

Suitable materials for use as the thinning agent or surface tension reducing agent are typically low molecular weight polar hydrocarbons, e.g., tert-butyl alcohol, n-butylineamine, diethylamine, ethyl ether, and isopentane. Methanol is particularly preferred for use with 2-methoxyethanol solvents. Methyl ethyl ketone is particularly preferred for use with xylenes, octane, and other apolar solvents. Inorganic compounds, such as ammonia may also be used. The thinning agent should be nonreactive in solution, but low revel reactivity is permitted if the solution will not be fundamentally altered before it is consumed. It is preferred that the thinning agent have a surface tension in air of 75% or less than the liquid precursor solution to which the thinning agent is added. This requirement means that the thinning agent will usually have a surface tension less than 20 dynes per centimeter at 20° C. The thinning agent should also have a boiling point greater than 60° C. at atmospheric pressure (for example, 64° C.) if it is to be used in misted deposition apparatus. Films of good morphology can be derived from solutions where the thinning agent is present in an amount up to 60% by volume of all of the solvents in the solution.

Mists or aerosols according to the invention are suspensions of liquid particles in a gas. The particles in the mists or aerosols are made of the liquid precursor solution. The particles typically have sizes in the colloidal size range, namely, at least one single dimension in the range form one nanometer to one micron. In this size range, the surface area of the particles is so much greater than its volume that unusual phenomenon occur, i.e., the particles do not settle out of the solution by gravity and are often small enough to pass through filter membranes. Colloidal sizes are not necessarily essential to the formation of an aerosol. It is necessary to deposit these particles on an integrated circuit substrate, e.g., a silicon wafer, to produce a thin film of the liquid precursor solution on the substrate.

A misted deposition apparatus is required for misting of the liquid precursor. Preferred misted deposition apparatus includes ultrasonic or venturi apparatus. The venturi apparatus uses the well-known principles of an automotive carburetor for misting of the liquid. These devices require manual adjustments with empirical measurements of the corresponding particle sizes.

Equation (1) below describes the particle size diameters of particles that are generated by the ultrasonic transducers in an ultrasonic mist generator:

$$D = \frac{1}{2} * \sqrt[3]{\frac{\pi}{F_a^2} * \frac{\gamma}{\rho}} \tag{1}$$

wherein D is the particle size diameter, $F_a$ is the frequency of ultrasound coming from the ultrasonic transducers, $\gamma$ is the surface tension of the liquid precursor solution, and p is the density of the liquid precursor solution. The intensity of applied ultrasonic energy does not affect the particle size diameter unless the precursor liquid begins to boil if too much energy is applied and converted to heat energy. The intensity of applied ultrasonic energy affects the volume of mist that is generated, but typically does not affect the particle size diameter.

It is apparent from Equation (1) that particles may be generated which are outside the colloidal range if the surface tension or density of the liquid precursor solution falls outside a range that will yield colloidal particles. The primary concern is for particles that are too large because these particles may wet the substrate by forming pools or beads of liquid that degrade the film quality.

According to Equation (1), the particle size diameter D may be modified by adjusting the surface tension $\gamma$ or density p of the liquid precursor solution. A decrease in the surface tension or an increase in the density results in the formation of smaller particles. Increasing the density of hydrocarbon solutions typically results in an increase in viscosity together with a corresponding increase in surface tension. Thus, density increases are typically overcome or exceeded by the corresponding increase in surface tension. On the other hand, it is possible to reduce particle sizes by adding a surface tension reducing agent. The effects of the thinning agent or surface tension reducing agent may be partially offset by corresponding decrease in solution density.

$$\gamma=\gamma_1 X_1+\gamma_2 X_2-\beta X_1 X_2 \tag{2}$$

wherein $\gamma$ is the altered surface tension of the solution in dynes per centimeter, $\gamma_1$ is the surface tension of the first solution in dynes per centimeter, $\gamma_2$ is the surface tension of the second solution in dynes per centimeter, $X_1$ is the concentration of the first solution determined as a mole percentage of the total solution, $X_2$ is the concentration of the second solution determined as a mole percentage of the total solution, and $\beta$ is an empirically derived temperature dependent constant.

It is also possible to reduce the surface tension by heating the solution. The applied ultrasound is capable of heating the solution. A problem that arises from heating the solution is that too much heating may cause the solution to boil with a corresponding fractional distillation of lighter solvents and surface tension reducing agents. The best surface tension reducing agents according to Equation (2) have relatively low boiling points. The distillation of lighter solution components can be disastrous because these components may condense on the misted deposition apparatus. This condensation may render the apparatus inoperable due to dripping of the condensed materials.

The liquid precursor is used in combination with a misted deposition apparatus having a barrier plate of substantially the same area as the substrate. Here, substantially the same area means that the area of the barrier plate in the plane of the substrate differs from the area of the substrate by only 10% or less. The barrier plate has a smoothness tolerance of 5% of the average distance between said barrier plate and said substrate. The deposited film shows better thickness uniformity than with barrier plates in which the area and tolerances are not within these parameters.

The misted deposition apparatus is used to make integrated circuits and comprises: a deposition chamber; a substrate located within the deposition chamber, the substrate defining a substrate plane; means for producing a mist of a liquid precursor; and means for flowing the mist through the deposition chamber substantially evenly across the substrate to form a film of the liquid precursor on the substrate, wherein the means for flowing includes a barrier plate disposed in spaced relation above the substrate and substantially parallel thereto, the area of the barrier plate in a plane parallel to the substrate being substantially equal to the area of the substrate in the substrate plane. Preferably, the barrier plate has a smoothness tolerance of 5% of the average distance between the barrier plate and the substrate. Preferably, the apparatus further includes means for maintaining the deposition chamber under vacuum, means for applying a DC bias between the barrier plate and the substrate, and means for adjusting the barrier plate to vary the distance between the barrier plate and the substrate. Preferably, the apparatus includes an injection nozzle assembly for injecting the mist into the deposition chamber, in a direction substantially parallel to the substrate plane, disposed in close proximity to and around the periphery of one side of the substrate, an exhaust assembly disposed in close proximity to and around the periphery of an opposite side of the substrate from the injection nozzle assembly, and the substrate, the barrier plate, the injection nozzle assembly, and the exhaust assembly collectively define a semi-enclosed area within the deposition chamber. Preferably, the apparatus includes means for rotating the substrate in a plane parallel to the substrate plane while the mist is being deposited on the substrate and means for applying ultraviolet radiation to the mist while the mist is flowing through the deposition chamber. Preferably, the deposition chamber is maintained at substantially ambient temperature while the mist is flowed into it.

Temperature changes are associated with corresponding changes in surface tension and mist particle sizes. The changes can be calculated by known information, e.g., the equation:

$$\gamma = \alpha - bT, \quad (3)$$

where $\gamma$ is the surface tension in dynes per centimeter, T is the temperature in degrees Celsius, and a and b are empirical constants, such as those published in J. J. Jasper, J. Phys. Chem Ref. Data 1, 841 pp. 5.91 to 5.113 (1972), which is hereby incorporated by reference to the same extent as though fully disclosed herein. Ultrasonic misting results in an undesirable heating of the precursor liquid, which may eventually cause the liquid to boil. The temperature of the liquid precursor is preferably kept below a level that results in boiling of the precursor liquid, and this temperature range is usually less than 40° C.

Other objects, advantages and salient features of the present invention will become apparent from the following detailed description in conjunction with the drawings.

BRIEF DESCRIPTION OF THE DRAWINGS

FIG. 1A is a cutaway side view of the deposition chamber portion of a misted deposition system according to the invention; and FIG. 1B is an enlarged view of a portion of FIG. 1A.

FIG. 2 is a plan view of an intake and exhaust nozzle assembly of the system of FIG. 1;

FIG. 3 is an enlarged plan view of an intake nozzle of the system of FIGS. 1 and 2;

FIG. 4 is a schematic side view of a mist generator of a misted deposition system according to the invention;

FIG. 5 is a schematic plan view of a buffer chamber and associated inlet and outlet ports according to the invention;

FIG. 6 is a flow chart showing the process of fabricating an integrated circuit according to the invention;

FIG. 7 is a top view of the preferred embodiment of a misted deposition system according to the invention;

FIGS. 8 and 9 show a barrier plate assembly and substrate in two different positions to illustrate the adjustable relationship between the barrier plate and the substrate;

FIG. 10 is a perspective view showing the placement of the ultraviolet radiation source within the deposition chamber according to the invention;

FIG. 11 shows a cross-sectional side view of a portion of an integrated circuit wafer fabricated with the apparatus and methods of the invention;

FIG. 12 is a plot of the optical (elipsometer) layer thicknesses versus BST molarity for various films that have been deposited according to the present invention;

FIG. 13 is a plot of thickness, dielectric constant, and tan $\delta$ versus methanol added to 9.5 ml of a 0.239M BST solution from which various thin films of BST were produced; and FIG. 14 is a plot of BST molarity versus the ratio of step coverage for various thin film samples.

DESCRIPTION OF THE PREFERRED EMBODIMENT

1. Overview—The Method and Results

A flow chart of the preferred embodiment of a process according to the invention is shown in FIG. 6 and a portion of an integrated circuit made by the process is shown in FIG. 11. In step P1 a substrate 5 is provided. In the art, the term "substrate" is used both in a general sense in which it may be any one or a number of layers 5 of material on which a layer of interest 1130 is deposited, and in a special sense in which it denotes a silicon wafer 1122 on which an integrated circuit 1110 is formed. Unless the context indicates otherwise, the word substrate herein will indicate any object on which a layer of material is deposited using the process and apparatus of the invention. The substrate referred to as being provided in step P1 preferably comprises a P-type silicon wafer 1122.

In step P2, the initial integrated circuit layers 1124, 1126, and 1128 are fabricated to form a substrate 5 on which a metal oxide layer 1130 is deposited. First, an approximately 5000 Å thick silicon dioxide insulating layer 1124 is wet grown. Typically, the $SiO_2$ layer is etched to form the shape necessary to create a given integrated circuit device 1112 upon deposition of appropriate layers of titanium 1126, platinum 1128, dielectric 1130, and platinum 1132. A thin layer 1126 of titanium metal is deposited on the silicon dioxide 1124, preferably by sputtering in situ, and a 2000 Å thick electrode of platinum is deposited on the titanium 1126, preferably by sputtering in situ. By "in situ" is meant that both the titanium and the platinum are sputtered without breaking vacuum. The titanium layer 1126 is optional. When used, it diffuses into the silicon dioxide and platinum and assists the platinum 1128 in adhering to the silicon dioxide 1124. A layer 1130 of a material such as lead zirconium titanate or barium strontium titanate or perovskite, or strontium bismuth tantalate or strontium bismuth niobium tantalate of layered superlattice material is then deposited utilizing the apparatus and methods of the invention discussed below. Another 2000 Å layer 1132 of platinum is deposited on the layer 1130. The wafer 1110 is then annealed, patterned with a photo-mask process, and etched down to the electrode layer 1128 to produce capacitor integrated circuit devices 1112, one of which is shown in cross-section in FIG. 11, which devices are tested by connecting one lead of the test device to the platinum electrode layer 1128 and contacting the other electrode layer 1132 with a fine probe connected to the other lead of the test device.

In step P6 a primer is prepared. In the preferred embodiment, this step comprises providing a quantity of a single solvent, such as 2-methoxyethanol, xylenes or n-butyl acetate, though it may include the step of combining several solvents, such as the three foregoing solvents. The preferred solvent, whether it will be a single solvent or a combination of solvents, is the final solvent of the precursor, that is, the solvent of the precursor that is applied in step P22, which will be described below. Some solvents that may be used as the primer, together with their boiling points, include: alcohols, such as 1-butanol (117° C.), 1-pentanol (117° C.), 2-pentanol (119° C.), 1-hexanol (157° C.), 2-hexanol (136° C.), 3-hexanol (135° C.), 2-ethyl-1-butanol (146° C.), 2-methoxyethanol (124° C.), 2-ethoxyethanol (135° C.), and 2-methyl-1-pentanol (148° C.); ketones, such as 2-hexanone (methyl butyl ketone) 127° C.), 4-methyl-2-pentanone (methyl isobutyl ketone) (118° C.), 3-heptanone (butyl ethyl ketone) (123° C.), and cyclohexanone (156° C.); esters, such as butyl acetate (127° C.), 2-methoxyethyl acetate (145° C.), and 2-ethoxyethyl acetate (156° C.); ethers, such as 2-methoxyethyl ether (162° C.) and 2-ethoxyethyl ether (190° C.); and aromatic hydrocarbons, such as xylenes (138° C.–143° C.), toluene (111° C.) and ethylbenzene (136° C.).

In step P8 the primer is applied to the substrate 5. In the preferred embodiment, to be described in detail below, the primer is misted, is screened through a mesh filter 33, and is applied to the substrate 5 is a deposition chamber 12. The term "mist" as used herein is defined as fine drops of a liquid carried by a gas. The term "mist" includes an aerosol, which is generally defined as a colloidal suspension of solid or liquid particles in a gas. The term mist also includes a vapor, a fog, as well as other nebulized suspensions of the precursor solution in a gas. Since the above terms have arisen from popular usage, the definitions are not precise, overlap, and may be used differently by different authors. Herein, the term aerosol is intended to include all the suspensions included in the text *Aerosol Science and Technology*, by Parker C. Reist, McGraw-Hill, Inc., N.Y., 1983, which is hereby incorporated by reference. The term "mist" as used herein is intended to be broader than the term aerosol, and includes suspensions that may not be included under the term aerosol, vapor, or fog. Ultraviolet (UV) radiation may be applied to the primer mist as it flows into and through the deposition chamber 11, or after it is applied to the substrate 5, as shown by the dotted lines P11 and P12, respectively, However, in the preferred embodiment, these steps P11 and P12 are skipped.

It has been found that the use of a primer prior to the deposition of the precursor results in films having better morphology and lower leakage current than with no use of a primer step P8.

In step P20 a precursor liquid is prepared. The precursor is preferably a metal-alkoxycarboxylate prepared as described in U.S. patent application Ser. No. 08/132,744, which is hereby incorporated by reference. A detailed example of the solution preparation is given below. The precursor prepared in step P20 is usually prepared in quantity and stored until needed. Just before application of the precursor, a solvent exchange step, a concentration adjustment step, or both is performed to provide an optimum precursor for the application. The solvent exchange step is described in detail in U.S. patent application Ser. No. 08/165,082, which is hereby incorporated by reference. The final precursor solution is preferably used as the sole source for the entire deposition process following the application of the primer. However, the invention also contemplates using multiple precursor sources in parallel or series. In particular, other sources may be used in parallel for doping or modifying the final desired compound.

The precursor liquids used in the present invention are stabilized solutions. Here, "stabilized" means that key oxygen-metal bonds of the desired final chemical compound are formed in the process of forming the precursor, and after such formation are stable. This has two aspects. First, the solutions do not react or deteriorate when stored over moderately long periods. Second, the bonds formed when forming the precursor remain stable throughout the deposition process and form at least a portion of the bonds in the final desired chemical compound. That is, the metal-oxygen bonds in the precursor remain stable and pass through the deposition process to form the metal-oxygen bonds of the final desired metal-oxide compound.

Step P21 embodies the concept of the present invention. The thinning agent or surface tension reducing agent is added to the precursor solution that was prepared in step P20. Alternatively, the precursor solution of step P20 may be prepared with the surface tension reducing agent in place; however, the low boiling points of the typical surface tension reducing agents in this circumstance most often prevent distillation of the solution to eliminate water and low boiling point ethers. In turn, the water and low boiling point ethers in solution are mildly reactive and degrade solution stability over a period of months.

In step P22, the screened mist of a precursor liquid is evenly flowed across and onto a substrate 5 at ambient temperature. Herein, ambient temperature means the temperature of the surroundings. That is, no additional heat, other than the heat from the surroundings, is applied to the substrate. When UV radiation is being applied, the temperature of the surroundings will be somewhat higher than room temperature, and when no UV radiation is being applied and a vacuum is being applied to treat the substrate, the ambient temperature can be somewhat less than room temperature. Based on the above, in general, ambient temperature may be between about −50° C. and 100° C. Preferably ambient temperature is between about 15° C. and 40° C.

As will be discussed further below, a key aspect of the flow process is that the mist is flowed across the substrate 5 via multiple input ports and exits the area above the substrate 5 via multiple exhaust ports, with the ports being distributed in close proximity to and about the periphery of the substrate 5 to create a substantially evenly distributed flow of mist across the substrate 5.

During, after, or both during and after deposition, the precursor liquid is treated to form a thin film of solid material on the substrate 5. In this context, "treated" means any one or a combination of the following: exposed to vacuum, ultraviolet radiation, electrical poling, drying, heating, and annealing. In the preferred embodiment UV radiation is applied to the precursor solution during deposition in step P24. The ultraviolet radiation is preferably also applied after deposition in step P28. After deposition, the material deposited on the substrate 5, which is liquid in the preferred embodiment, is also preferably exposed to vacuum for a period, then is heated, and then annealed. The chemistry of the UV cure process is not entirely understood. It is believed that the UV assists in disassociating the metal-oxide molecules, or other elements that comprise the desired final chemical compound, from the solvent and the organics or other fragments of the precursor compounds.

Drying occurs in step P26 to remove volatile organic moieties form the thin film of solution on the substrate. The precursor is preferably dried on a hot plate in a dry air atmosphere and at a temperature of from about 200° C. to 500° C. for a sufficient period of time to remove substantially all of the organic materials from the liquid thin film and leave a dried metal oxide residue. This period of time is preferably from about one minute to about thirty minutes. A 400° C. drying temperature for a duration of about two to ten minutes in air is most preferred. These temperatures may be correspondingly reduced if a vacuum is drawn on the atmosphere surrounding the substrate 5. Rapid thermal processing, e.g., through a halogen lamp, may also be used in the drying step.

Figure 11:
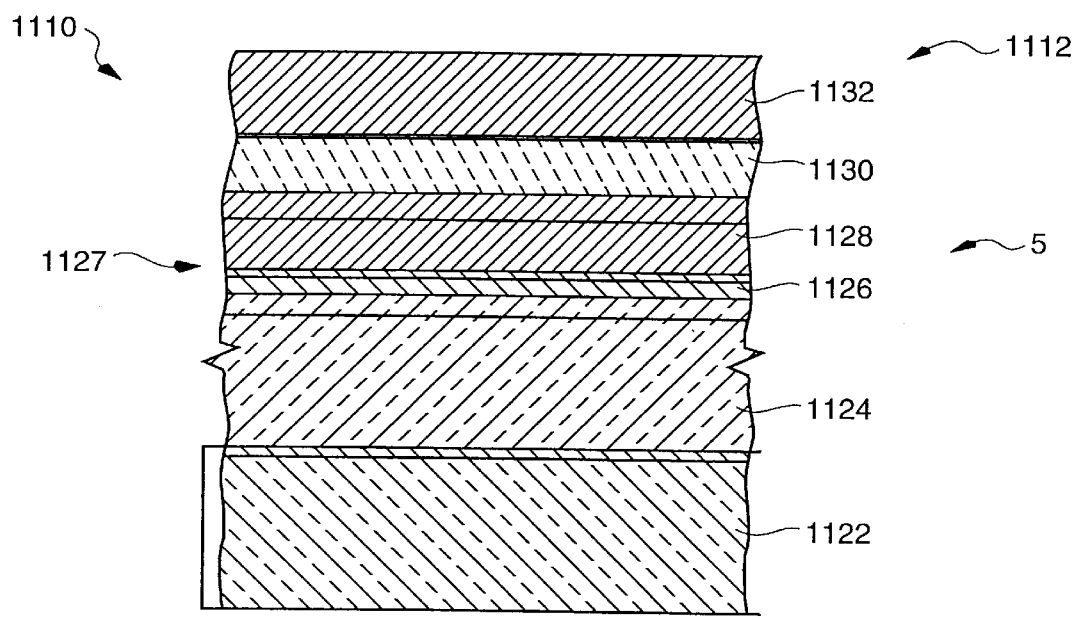

The dried precursor is annealed in step P30 to form the desired metal oxide of layer 1130 (see FIG. 11). This annealing step is referred to as the first anneal to distinguish it from a later annealing step. The first anneal is preferably performed in oxygen at a temperature of from 500° C. to 1000° C. for a time from 30 minutes to 2 hours. Step P30 is typically performed at from 700° C. to 800° C. for 80 minutes, with the most preferred anneal temperature being about 750° C. The first anneal of step P30 preferably occurs in an oxygen atmosphere in a push/pull process including 10 minutes for the "push" into the furnace and 10 minutes for the "pull" out of the furnace. The indicated anneal times include the time that is used to create thermal ramps into and out of the furnace.

An important parameter of many complex thin films, such as ferroelectric films, is that they are generally required to be quite thin (for example, within a range of 200–5000 Å).

Such film thicknesses can be readily achieved by the process and apparatus according to the invention. The invention can also be used to generate much thicker films, if desired.

The invention is well-suited for the deposition of high quality thin films of compounds such as ferroelectrics, super-conductors, materials with high dielectric constants, and gems, etc. For example, the invention can be used to deposit thin films of ferroelectric materials having a general composition of $ABO_3$, including $PbTiO_3$, $Pb_xZr_yTiO_3$, $Pb_xLa_yZr_zTiO_3$, and $YMnO_3$, where Y represents any rare-earth element. In addition, the invention can also be used to deposit thin films of barium strontium titanate [$(Ba, Sr)TiO_3$], strontium titanate ($SrTiO_3$), as well as other multi-element compounds, such as those described in U.S. patent application Ser. No. 07/965,190, filed on Oct. 23, 1992, titled "Layered Superlattice Materials for Ferroelectric, High Dielectric Constant, and Integrated Circuit Fabrication", which is hereby incorporated by reference.

2. Deposition Apparatus

As shown in FIG. 1A, there is a thin film deposition apparatus according to one exemplary embodiment of the invention, the apparatus being generally designated at 1. Apparatus 1 comprises a deposition chamber 2 containing a substrate holder 4, a barrier plate 6, an input nozzle assembly 8, an exhaust nozzle assembly 10, and an ultraviolet radiation source 16. The deposition chamber 2 includes a main body 12, a lid 14 which is securable over the main body 12 to define an enclosed space within the deposition chamber 2. The chamber is connected to a plurality of external vacuum sources described below. Lid 14 is pivotally connected to the main body 12 using a hinge as indicated at 18. In operation, a mist and inert carrier gas are fed in through tube 45, in direction 43, and pass through input nozzle assembly 8, where the mist is deposited onto substrate 5. Excess mist and carrier gas are drawn out of deposition chamber 2 via exhaust nozzle 10.

Substrate holder 4 is made from two circular plates 3, 3' of electrically conductive material, such as stainless steel, the top plate 3 being insulated from the bottom plate (field plate) 3' by an electrically insulative material 7, e.g., acetal resins such as Delrin. In an exemplary embodiment, utilizing a 5 inch diameter substrate 5, substrate holder 4 is nominally 6 inches in diameter and supported on a rotatable shaft 20 which is in turn connected to a motor 18 so that holder 4 and substrate 5 may be rotated during a deposition process. An insulating shaft 22 electrically insulates the substrate holder 4 and substrate 5 supported thereon from the DC voltage applied to the deposition chamber main body 12 so that a DC bias can be created between the substrate holder 4 and barrier plate 6 (via chamber main body 12). Such a DC bias may be utilized, for example, for field-poling of thin films as they are being deposited on the substrate 5. Insulating shaft 22 is connected to shaft 20 and shaft 20' by couplings 21. Electrical source 102 is operatively connected across main body 12 of deposition chamber 2 at connection 108 by lead 106 and via feed through 23 to brass sleeve 25 by lead 104 to effect a DC bias between field plate 3' and barrier plate 6.

Barrier plate 6 is made of an electrically conductive material such as stainless steel, and is of sufficiently large size to extend substantially over the substrate 5 in parallel thereto so that a vaporized source or mist as injected through input tube 26 and nozzle assembly 8 is forced to flow between barrier plate 6 and the substrate holder 4 over the substrate 5. Barrier plate 6 is preferably the same diameter as the substrate 5. It has been found that the best results are obtained if the area of barrier plate 6 in a plane parallel to the substrate varies from the area of the substrate 5 by 10% or less. That is, the area of the barrier plate 6 is no more than 10% bigger than the area of substrate 5 nor no less than 10% smaller than the area of substrate 5. As depicted in FIG. 1, the barrier plate 6 is preferably connected to the lid 14 by a plurality of rods 24 so that the plate 6 will be moved away from the substrate 5 whenever the lid is opened.

FIGS. 8 and 9 show barrier plate 6 located at various distances from substrate holder 4. Each of the rods 24 is typically a stainless steel rod attached to deposition chamber lid 14. Each rod 24 is bored to accommodate a bolt 35 (FIG. 1B) by which the rod 24 is attached to barrier plate 6. Each rod 24 is tapped to accommodate a set screw 36 which secures bolt 35 to the rod 24. By loosening set screw 36, re-positioning rod 24 relative to bolt 35, and then re-tightening set screw 36, the effective length of each rod is adjustable up to ½ inch without having to remove the rod 24 from the chamber lid 14. Each of the rods 24 is removable to allow sets of rods 24 of different lengths, L, L', etc. to be substituted in order to coarsely adjust the corresponding spacing S, S', etc. between barrier plate 6 and substrate holder 4 (and substrate 5) depending on the source materials, flow rate, etc. For example, the rod length L may be adjusted to provide a spacing S in the range of 0.10–2.00 inches. Once in place, rods 24 are also adjustable as indicated above. Thus, rods 24, bolts 35, and set screws 36 comprise an adjusting means for adjusting the barrier plate 6. The spacing between substrate 5 and barrier plate 6 is preferably approximately between 0.35 inches and 0.4 inches when a precursor liquid of barium strontium titanate, as prepared below, is deposited. Preferably the barrier plate 6 has a smoothness tolerance of up to 5% of the distance between the barrier plate 6 and substrate 5. That is, the distance between the substrate 5 and the barrier plate 6 at any given point differs from the distance between the substrate 5 and the barrier plate 6 at any other point by 5% or less of the average distance between the substrate 5 and the barrier plate 6. For example, if the average distance between the substrate 5 and the barrier plate 6 is 0.38 inches, no point on the substrate will be more than 0.40 inches from the barrier plate or less than 0.36 inches from the barrier plate.

It has been found that a barrier plate within the tolerances described above, that is, the barrier plate has an area that is approximately the same as the substrate and a smoothness tolerance of 5% or less, provides better thickness uniformity and a higher deposition rate than barrier plates outside the aforesaid tolerances.

FIG. 7 is a top view of the apparatus of an exemplary embodiment of the invention. As shown in FIG. 7, a 0–1000 Torr temperature compensated capacitance manometer 710 monitors the pressure in deposition chamber 2, and its signal controls a downstream control valve (not shown) to maintain precise pressures in deposition chamber 2. High vacuum pump-down of deposition chamber 2 to below $5.0 \times 10^{-6}$ Torr is accomplished with valve 713 opened. High vacuum pump-down of deposition chamber 2 is used to facilitate absorption of moisture from the chamber walls as well as from a substrate 5 located inside of the chamber, prior to a deposition operation.

Deposition chamber 2 is vacuum pumped to a pressure of between approximately 100 and 800 Torr during a deposition operation. The deposition chamber exhaust system includes a liquid nitrogen cold trap 709 connected to process chamber 2 via valve 726. Access to an external chamber (not shown) from deposition chamber 2 is provided through an air-operated slit valve 703. The interior of deposition chamber 2 can be viewed during a deposition operation through view port 718.

The precursor liquids are provided with mass flow controller 708 and VCR valve 725-3 to control the dispersion rates of precursors through buffer chamber 42 into deposition chamber 2 by regulating the flow of an inert gas such as argon(or an nonreactive gas such as nitrogen) from source 736 into mist generator 46-1. Additional mass flow controller 748 and valve 725-4 are connected to mist generator 46-2 which connects to buffer chamber 42 via VCR valve 725-5 to control the dispersion rates of primers through buffer chamber 42 into deposition chamber 2 by regulating the flow of an inert gas such as argon from source 736 into mist generator 46-2. A separate mass flow controller 785 is used to introduce oxygen from source 738 and/or other inert or process-active gases into buffer chamber 42 via VCR valve 725-7.

Figure 2:
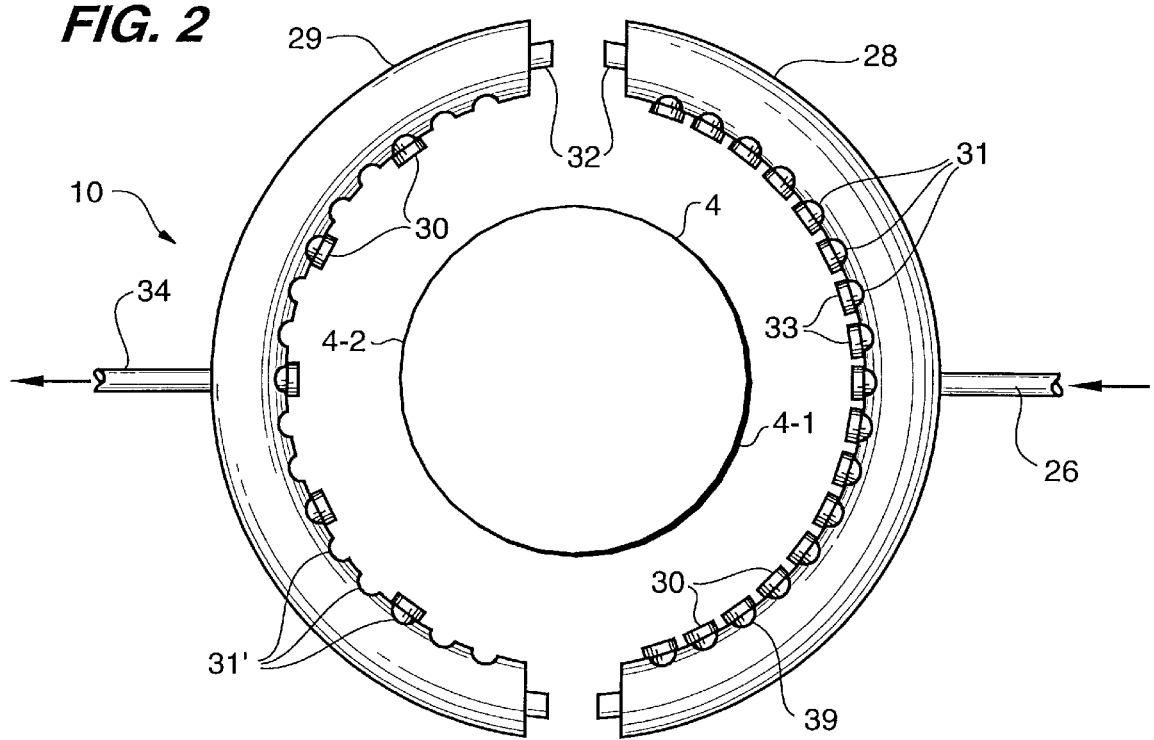

The input nozzle assembly 8 and the exhaust nozzle assembly 10 are more particularly shown with reference to FIG. 2. Input nozzle assembly 8 includes an input tube 26 which receives a misted solution from buffer chamber 42 as discussed below in relation to FIG. 5. Input tube 26 is connected to arcuate tube 28 which has a plurality of small holes or input ports 31 for accepting removable screws 30 and removable input nozzles 33 spaced ¼ inch center-to-center along the inner circumference of the tube 28.

Figure 3:
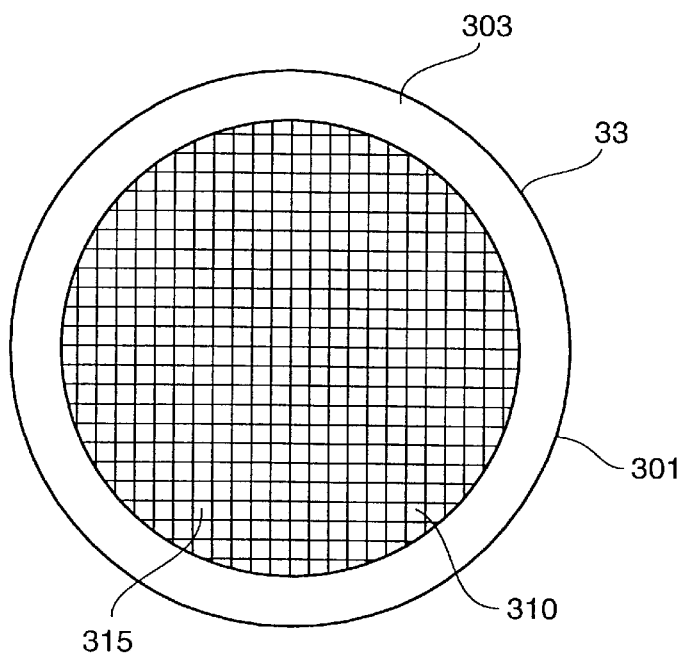

A plan view of an input nozzle 33 is shown in FIG. 3. It includes a screw 33 having an enlarged, hollow screw head 301 having a rim 303, and hollow screw stem 39 (FIG. 2), and a mesh filter 310. Mesh filter 310 is preferably friction fit inside screw head 301 before the head 301 is attached to the stem 39, but also may be brazed to the outer surface of rim 303. Preferably, all portions of nozzle 33, including mesh filter 310, are made of stainless steel. Preferably mesh filter 310 is a stainless steel, woven mesh filter having spacings 315 between the mesh strands of approximately one square micron. It has been found that, with everything else being equal, the use of such a mesh filter lowers the deposition rate somewhat, but this is easily overcome by increasing the number of ports 31 and/or the size of the ports. The filter collimates the mist so that the flow of the mist over the substrate is more uniform and less turbulent, and thus there is less chance of anomalies in the flow appearing, which anomalies can create non-uniformities.

Exhaust nozzle assembly 10 comprises an arcuate exhaust tube 29 having a plurality of small holes or exhaust ports 31' with removable screws 30. The structure of the exhaust nozzle assembly 10 is substantially the same as that of the input nozzle assembly 8, except that it does not include input nozzles 33 and a tube 34 leads to a vacuum/exhaust source (not shown). End caps 32 of tubes 28 and 29 are removable for cleaning. Arcuate tube 28 of input nozzle assembly 8 and the corresponding arcuate tube 29 of exhaust nozzle assembly 10 respectively surround oppositely disposed peripheral portions 4-1, 4-2 of substrate holder 4.

In an exemplary embodiment wherein a BST film is to be deposited, the centers of holes 31, 31' in tubes 28 and 29 are nominally located 0.375 inches above substrate holder 4. However, as shown in FIGS. 8 and 9, this distance is adjustable to suit the specific deposition process.

Each of the tubes 28, 29, is typically fabricated from ¼" O.D. stainless steel, with an inner diameter of approximately 3/16". The interior walls of each tube 28,39 are preferably electro-polished. Holes, 31, 31' in tubes 28 and 29 respectively are spaced approximately ¼" center-to-center, and are tapped to accommodate 4–40 (⅛") socket head screws.

Through each structure, and by adjusting the location of nozzles 33 by selectively inserting nozzles 33 in place of screws 30 in arcuate tube 28, and adjusting the location of open exhaust holes 31' by selectively removing screws 30 in arcuate tube 29, the flow of a vaporized solution or mist over the substrate 5 can be well controlled for various solutions and flow rates, etc., to achieve a uniform deposition of a thin film on substrate 5.

Referring to FIGS. 1 and 2, substrate holder 4, barrier plate 6, input nozzle assembly 8 and exhaust nozzle assembly 10 collectively cooperate to define a relatively small, semi-enclosed deposition area 17 surrounding an upper/exposed surface of the substrate 5, and within which the vaporized solution is substantially contained throughout the deposition process.

Although exemplary embodiments of substrate holder 4, barrier plate 6, input nozzle assembly 8 and exhaust nozzle assembly 10 are shown and described, it is understood that variations of such structures can be utilized within the scope of the present invention. For example, the arcuate input and exhaust tubes 28 and 29 could be replaced with tubes of other structures such as V-shaped or U-shaped tubes, or slotted tubes, or shower-head shaped apparatus over the substrate holder 4, or could simply be replaced by a plurality of separate nozzles and separate exhaust ports.

Figure 5:
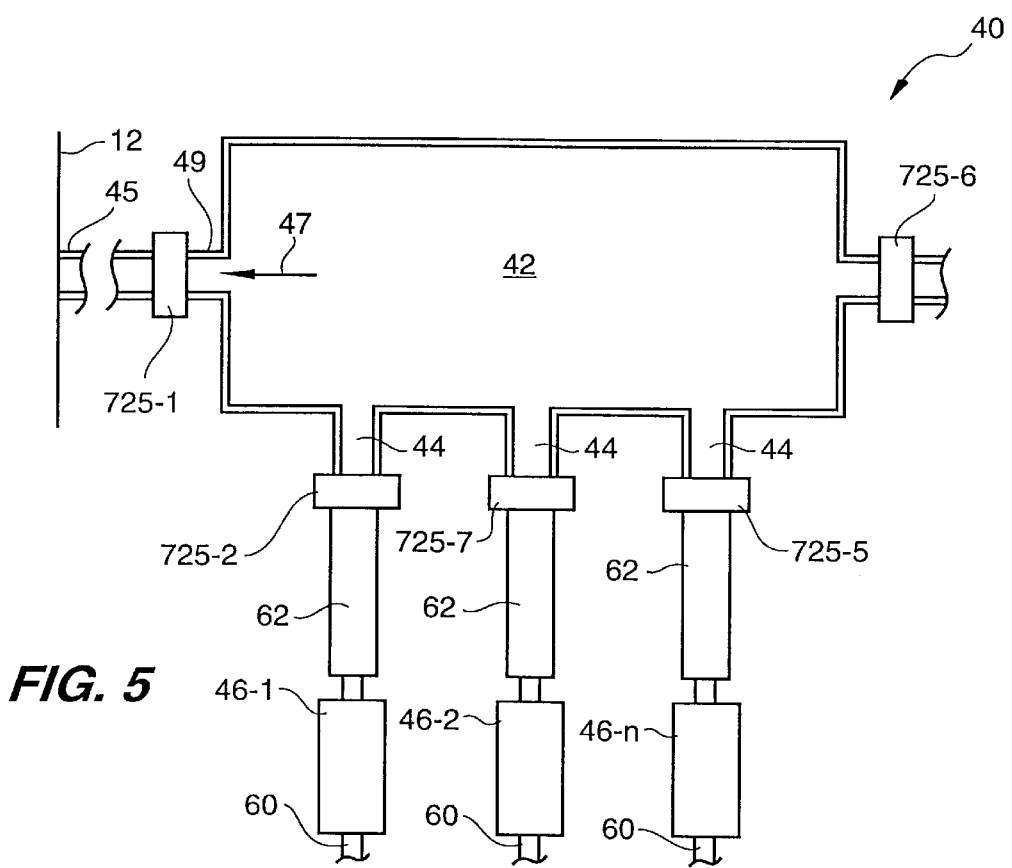

FIG. 5 shows a cross-sectional view of a manifold assembly 40 according to the present invention. The manifold assembly 40 is utilized for supplying a vaporized solution (mist or aerosol) to input nozzle assembly 8, and generally comprises a buffer chamber 42, a plurality of inlets 44 which are connected to corresponding mist generators through respective valves 725-2, 725-5, 725-7, a deposit valve 725-1, for regulating flow from the buffer chamber 42 to the nozzle assembly 8, and an exhaust vent valve 725-6. It is a feature of the invention that the inlets 44 from valves 725-2, 725-5, and 725-7 are at a 90 degree angle from outlet 49 to deposit valve 725-1. Buffer chamber 42 is large enough so that the mists will spend, on the average, about one to five minutes in the chamber, and, preferably, about 2.5 minutes. This time frame and the 90 degree angle between the inlets 44 and outlet 49 permits any large droplets in the mist, which can cause surface morphology problems to settle out, i.e. droplets larger than about two microns. When more than one mist is used at the same time, as for example, when both a primer and precursor are introduced together (see below), it permits the mists to mix until they form a single, homogeneous mist. In the preferred embodiment, buffer chamber 42 was preferably a cylinder of about 3 inches in inside diameter (the vertical direction i FIG. 5) and approximately about four inches long (the horizontal direction in FIG. 5) and was made of stainless steel.

In use, one or more of the mist generators 46-1, 46-2, 46-n, are utilized to generate one or more different mists which are then flowed into the buffer chamber 42 through valves 725-2, 725-7, and 725-5 and respective inlets 44.

The mists as flowed into the buffer chamber 42 are mixed to form a single, uniform misted solution which is then flowed into the deposition chamber 2 at an appropriate flow rate through the valve 725-1 and input tube 25. Valve 725-1 can be selectively closed off so that the deposition chamber 2 can be pumped down if desired, or to clean and purge the manifold system when necessary. Similarly, the outlet of the exhaust valve 725-6 is connected to a vacuum source (not shown) so that, when necessary to exhaust-purge one or more of the mist generators 46, valve 725-1 can be closed off, valve 725-6 and one or more of the valves 725-* can be opened, and the buffer chamber 42 can be pumped down to clean and purge the mist generator(s) 46 and the buffer chamber 42 by applying a vacuum via pump (not shown) or using standard negative draw type exhaust.

Figure 4:
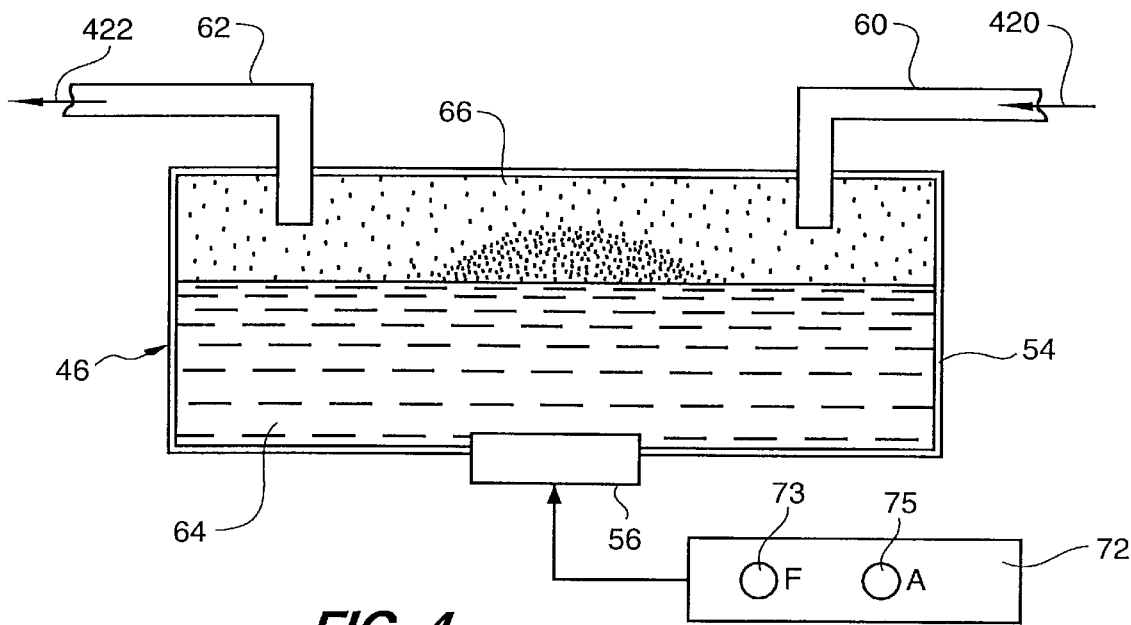

Stabilized precursor solutions are agitated ultrasonically to atomize or nebulize the solutions to produce a mist of the stabilized precursor solution(s) before they are introduced into the deposition chamber 2. FIG. 4 illustrates a schematic side view of an exemplary embodiment of the mist generating apparatus used in the present invention. Mist generator 46 includes a closed container 54, a TDK TU-26B or equivalent ultrasonic transducer 56 fluid-tightly and vacuum sealed into the bottom of the container 54, and a power source 72 for which both the frequency and amplitude may be varied. Container 54 is a modified Millipore Waferguard T-Line gas filter unit (catalog no. YY50 005 00) without the internal filter cartridge. The direction of gas flow as indicated by arrows 420 and 422 is opposite to that which would be used in normal operation of the filter Transducer 56 is mounted in a recessed hole in bottom section of mist generator 46. Mist generator 46 also includes an inlet port 60 and an outlet port 62 for passing a carrier gas through the container 54. Power source 72 includes a frequency control means, i.e. frequency control dial 73, which can be turned to adjust the frequency of the transducer 56, and an amplitude control means 75, i.e. amplitude control dial 75, which can be turned to adjust the amplitude of the output of transducer 56. By adjusting the frequency and amplitude of the transducer, the particle size of the mist can be controlled. Adjusting the particle size enables one to adjust the surface morphology, step coverage, and deposition rate of the deposition process.

Before operation, a predetermined amount of precursor liquid 64 is introduced into container 54. During operation, transducer 56 is electrically activated to generate a mist 66 of the precursor liquid, and an inert carrier gas is passed into the mist 66 via port 60 where it becomes wet or saturated with the mist, and the wet carrier gas is then passed from the outlet port 62 into the manifold assembly 40. The carrier gas is normally an inert gas such as argon, helium, or nitrogen, but may comprise a reactive gas in appropriate situations.

The mist generator 46 as shown in FIG. 4 is particularly advantageous because it creates a vaporized solution which can be effectively flowed or injected into the deposition chamber 2 without complications such as freezing.

Figure 10:
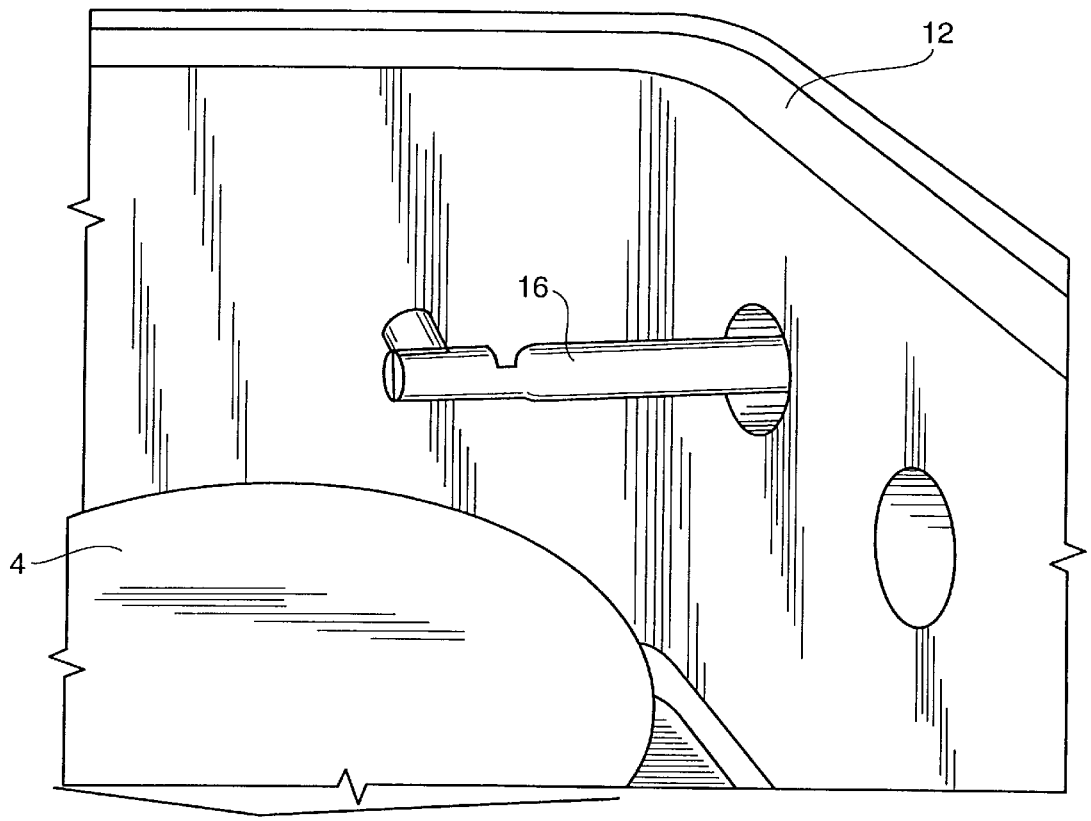

FIG. 10 is a perspective view showing the placement of an ultraviolet radiation source 16 within the deposition chamber 2. Photo-enhancement of the present process is effected by providing UV (ultraviolet) light during and after the deposition process, which UV radiation is believed to stimulate the disassociation of solvent and organics from the precursor, thereby accelerating the drying process. In addition, the use of UV radiation prior to the deposition process facilitates the removal (desorption) of moisture from deposition chamber 2 as well as from substrate 5. The location of ultraviolet light source 16 within the deposition chamber is not critical because of the fact that the ultraviolet radiation is reflected off of the stainless steel walls of deposition chamber 2 into the space between the input nozzle 8 and exhaust nozzle 10, as well as onto substrate 5, where the radiation can provide the above-described photo-enhancement effect.

UV source 16 includes at least one UV lamp located in deposition chamber 2, for applying an ultraviolet radiation bath therein. Spectral sources which could be used include ultraviolet lamps and excimer lasers. In either case, the radiation bath applied by UV source 16 is tuned to optimize the dissociation of the desired chemical compound from the solvent and the organics or other fragments. In the first case, radiation emitted by an excimer laser is spectrally "tuned" to correspond to the energy needed to dissociate or crack the solvent bonds, the precursor chemical compound bonds and/or any intermediate organic complex bonds formed during the deposition process holding the desired compound in a given precursor liquid. Alternatively, if UV source 16 is a UV lamp (or plurality of lamps), then "tuning" is accomplished by exchanging one (or a set) of the UV lamps with another one (or set) of UV lamps which have a more desirable frequency spectrum.

If a ferroelectric thin film is being deposited from a vaporized alkoxycarboxylate source, as for example when depositing a precursor to form barium strontium titanate (BST) as described below, it is preferable to use a Danielson Phototron PSM-275 UV radiation source 16 which emits UV radiation rays having a wavelength of approximately 180–260 nanometers. UV radiation in this wavelength range is particularly effective in resonanting and dissociating the bonds holding the BST in the vaporized alkoxycarboxylate, sol-gel, MOD, or other liquid chemical source.

Apparatus 1 shown in FIG. 1 includes electrical means 102 for applying a DC bias in the deposition chamber 2 during a deposition operation. Electrical means 102 includes DC input 104 and output 106. The DC potential applied between input sleeve 25 and deposition chamber main body 12 is typically 350 volts. The DC bias achieves poling in-situ of the ferroelectric film adding to the film quality. Dipole ordering along the crystal c-axis (the major polarization axis) is often desirable, and the resulting ordering reduces dislocation density which can be responsible for fatigue and retention problems. A DC bias of either greater than or less than 350 volts could also be used to effectuate the above results. In addition, while deposition is occurring, combinations of ultraviolet radiation and DC bias may be applied within chamber 2 either together or sequentially, and repeated.

Figure 6:
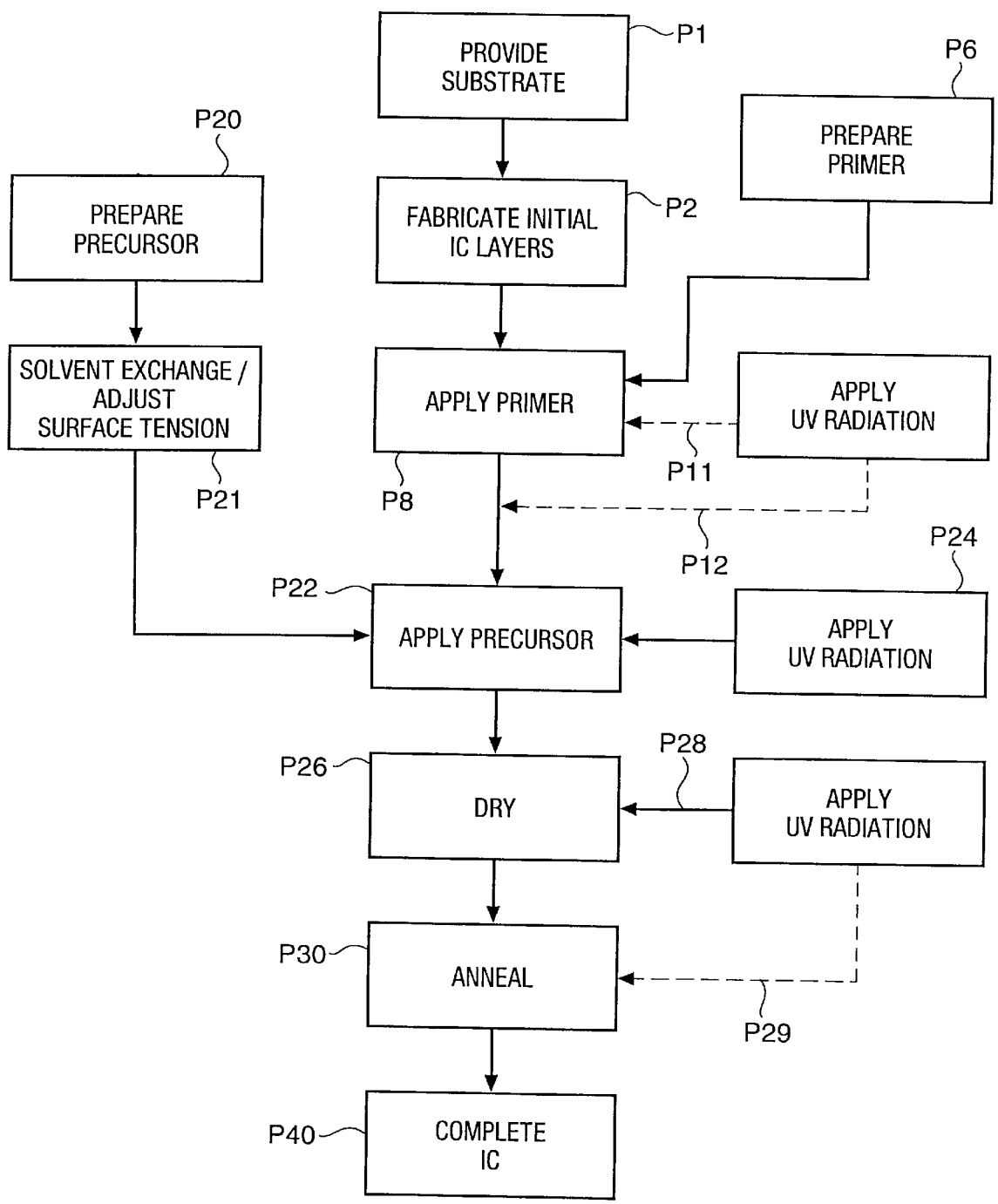

A supplemental heating means, such as a hot plate, (not shown) may be used to bake and/or anneal a film or a precursor liquid which has previously been deposited on a substrate, the baking and annealing being preferably conducted in an auxiliary chamber, although the baking/annealing process could be performed within the deposition chamber 12, as discussed in relation to step $P_{11}$ and $P_{12}$ of FIG. 6. The annealing is preferably performed in an oxygen furnace. High energy density ultraviolet radiation, such as from a diffused excimer laser source is also a preferred method of annealing.

3. Working Examples

EXAMPLE 1

PRODUCTION OF A BARIUM STRONTIUM TITANATE SOLUTION

A detailed example of the process of preparing barium strontium titanate (BST) precursors and fabricating a capacitor utilizing BST as the capacitor dielectric follows.

TABLE I

| | $Ba_{0.7}Sr_{0.3}TiO_3$ | | | |
|---|---|---|---|---|
| Compound | FW | grams | mmole | Equiv. |
| Barium | 137.327 | 9.4255 | 68.635 | 0.69986 |
| 2-ethylhexanoic acid | 144.21 | 19.831 | 137.51 | 1.4022 |
| Strontium | 87.62 | 2.5790 | 29.434 | 0.30014 |
| 2-ethylhexanoic acid | 144.21 | 8.5005 | 58.945 | 0.60107 |
| Titanium isopropoxide | 284.26 | 27.878 | 98.072 | 1.0000 |

In Table I, "FW" indicates formula weight, "grams" the weight in grams, "mmoles" indicates millimoles, and "Equiv." indicates the equivalent number of moles in solution. The quantities of materials as indicated in Table I were measured to begin step P20 (FIG. 6). The barium was placed in 100 ml of 2-methoxyethanol and allowed to react. The first measure of 2-ethylhexanoic acid was added to the mixture and stirred. The strontium was then added to the mixture. Once it was finished reacting, the second measure of the 2-ethylhexanoic acid was added to the mixture. The mixture was heated to a maximum temperature of 115° C. and stirred to distill out all water. The mixture was allowed to cool. The titanium isopropoxide was added to the mixture, which was then diluted to 220 ml with additional 2-methoxyethanol. The mixture was heated to a maximum temperature of 116° C. and stirred. All isopropanol and water were then distilled out to complete step P20. In step P21, the mixture was then diluted out to exactly 410 ml with additional 2-methoxyethanol. The resultant mixture had a 0.239M concentration, wherein the ratio of Ba to Sr=0.69986:0.30014.

* * *

The chemical reactions involved in the formation of the precursor solution composed of barium 2-ethylhexanoate, strontium 2-ethylhexanoate, and titanium 2-methoxyethoxide are described below:

EXAMPLE I

Barium 2-ethylhexanoate (barium metal+(2-ethylhexanoic acid)→ (barium 2-ethylhexanoate)+(hydrogen gas): (4)

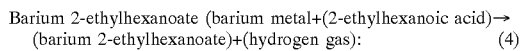

EXAMPLE II

Strontium 2-ethylhexanoate (strontium metal)+(2-ethylhexanoic acid)→(strontium 2-ethylhexanoate)+(hydrogen gas): (5)

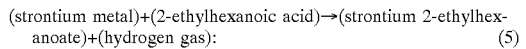

EXAMPLE III

Titanium 2-methoxyethoxide (titanium isopropoxide)+(2-methoxyethanol)→(titanium 2-methoxyethoxide)+(isopropyl alcohol): (6)

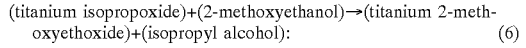
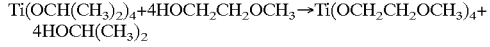

The use of 2-methoxyethanol as a solvent allows removal of any water present by distillation, as 2-methoxyethanol's higher boiling point allows it to remain behind while $H_2O$ boils away. Thus, the resulting precursor is essentially anhydrous. Barium and strontium 2-ethylhexanoate are used because thin films formed utilizing medium chain length carboxylates like these in the precursors do not crack, blister or peel on baking as do the thin films formed utilizing longer chain carboxylates. Strontium and barium 2-methoxyethoxide were tried, but proved excessively air- and water-sensitive. Titanium 2-methoxyethoxide gives better films than the air-insensitive titanium 2-ethylhexanoate, but while titanium 2-methoxyethoxide is air-sensitive, it is less air-sensitive than titanium isopropoxide.

The 2-methoxyethanol also reacts with transition metals to provide an intermediate metal alkoxide, e.g., barium 2-methoxyethoxide in the Example above. The alkoxide ligands of this intermediate metal alkoxide are substituted by carboxylate ligands, e.g., the 2-ethylhexanoic acid of the Example above, in an exothermic reaction to provide a metal carboxylate or less completely substituted metal alkoxycarboxylate.

According to a generalized reaction theory, if a metal-alkoxide is added to the metal-alkoxycarboxylate, and the solution is heated, the following reactions occur:

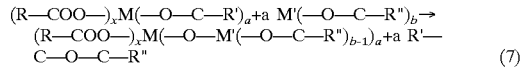 (7)

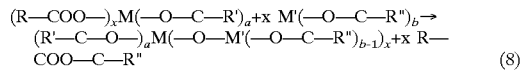 (8)

where M and M' are metals; R, R', and R" are alkyl groups preferably having from zero to sixteen carbons; and a and b are integers denoting relative quantities of corresponding substituents. Generally the reaction of equation (7) will occur first since metal alkoxides react more readily than metal carboxylates. Thus, ethers having low boiling points are generally formed. These ethers boil out of the precursor, thus leaving a final precursor having a reduced organic content and the metal-oxygen-metal bonds of the final desired metal oxide already partially formed. If the heating is sufficient, some of the reaction (8) will also occur, creating metal-oxygen-metal bonds and esters. Esters generally have higher boiling points and remain in solution. These high boiling point organics slow down the drying process after the final precursor is applied to a substrate, which tends to reduce cracking and defects; thus, in either case, metal-oxygen-metal bonds are formed and the final precursor performance is improved.

If a metal-carboxylate is added to the metal-alkoxycarboxylate and the mixture is heated, the following reaction occurs:

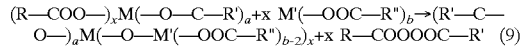 (9)

where R—COOOC—R' is an acid anhydride, and the terms are as defined above. This reaction requires considerably more heat than do the reactions (7) and (8) above. and proceeds at a much slower rate.

In addition to the above reactions which produce metal-alkoxycarboxylates, reactions occur such as:

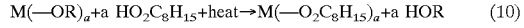 (10)

where the terms are as defined above. This reaction completely substitutes the alkoxide portion of the intermediate metal-alkoxycarboxylate to a full metal carboxylate; however, it is now believed that a complete substitution of the alkoxides by the carboxylates does not occur with the parameters as disclosed herein. Full substitution of the carboxylates requires significantly more heating, and even then may not readily occur.

EXAMPLE 2

ADDITION OF A SURFACE TENSION REDUCING AGENT

A 9.5 ml aliquot was taken from the 0.239M solution of Example 1. A 5.0 ml quantity of methanol was added as a surface tension reducing agent to dilute the solution concentration to 0.156M.

EXAMPLE 3

PRODUCTION OF A THIN FILM CAPACITOR

The BST precursor formed as described in Example 2 was used in the method of the invention shown in FIG. 6, with the apparatus of the invention shown in FIGS. 1–5 and 7–10, to fabricate a capacitor as shown in FIG. 11.

The BST precursor was placed in container 54 of mist generator 46-1 (FIG. 7), and a 2-methoxyethanol solvent was placed in container 54 of mist generator 46-2. Initially, a substrate comprising a silicon wafer with layers of silicon dioxide and platinum deposited on it was pre-baked in an oven at atmospheric pressure (@ Colorado Springs, Colo.) at 180° C. for 15 minutes. The substrate was placed in the deposition chamber on the substrate holder 4. The deposition chamber was pumped down to 0.4 Torr via a rough pump (not shown) connected to valve 726. Next, substrate rotation motor 18 was turned on to rotate substrate holder 4. The deposition chamber was slowly back filled via valves 727 and 707 with an inert gas source 704 to a pressure of approximately 595 Torr. Next, the process vacuum line 702 was opened to stabilize the deposition chamber pressure at approximately 595 Torr. A DC bias of 350 volts was applied between a substrate holder and a barrier plate.

The primer was applied to the substrate using an argon carrier gas under 350 V DC bias with no UV. Valve 725-6 was closed and injection valve 725-1 and deposit valves 725-4 and 725-5 were then opened to start a 100 SCCM flow of argon from source 736 through ultrasonic mist generator 46-2 which was then turned on for one minute to cause a thin film of approximately 100 angstroms of primer to be deposited at ambient temperature on the substrate. Deposit valve 725-1 was then closed, valve 725-6 was then opened and the transducer 56 associated with mist generator 46-2 was turned off, to vent buffer chamber 42 through vent 705 until mist generator 46-2 reached ambient temperature. Buffer chamber 42 was purged through vent 705 by applying argon gas from source 736. Then valves 725-4 and 725-5 were closed.

The liquid precursor solution was deposited using an argon carrier gas under DC bias and no UV. Deposit valve 725-1 was reopened and valves 725-3 and 725-2 were also opened to flow argon from source 736 through ultrasonic mist generator 46-1 which was then turned on for 20 minutes to cause a film of approximately 800 angstroms to be deposited at ambient temperature on the substrate. The deposition process used argon carrier gas to flow both the primer mist and the BST precursor mist over the substrate 5. After a sufficient amount of the BST precursor was deposited on the substrate to produce a thin film, the mist generator 46-1, and the substrate rotation motor were turned off. Deposit valve 725-1 was closed and valve 725-6 was opened to vent buffer chamber 42 through vent 705 until mist generator 46-1 reached ambient temperature. Buffer chamber 42 was purged through vent 705 by applying argon gas from source 736. While the wafer remained in the deposition chamber, the chamber was slowly pumped down to 0.4 Torr. Next, valve 713 was closed and the deposition chamber was vented to atmospheric pressure. The wafer was then removed from the deposition chamber and post-baked at 400° C. for two minutes. The wafer was then annealed in an oxygen atmosphere at 800° C. for 80 minutes. The wafer was then etched using well-known photo-resist techniques to produce a plurality of electronic devices 1112.

The above process was repeated for numerous samples. Table 2 below summarizes the results. Effects were studied for variations in argon flow rate, BST solution molarity, and anneal temperature.

TABLE 2

| | Solution Composition | | | | Wait before and after deposition | | Drying conditions | | Anneal Conditions | | Elipsometer | SEM Measurements | | | Electrical Test | |
|---|---|---|---|---|---|---|---|---|---|---|---|---|---|---|---|---|
| Run # | BST M | BST ml | CH$_3$OH ml | Final M | Ar Flow SCCM | Pre Dry min. | Post Dry Hr. | Min. | Temp ° C. | Min. | Temp ° C. | Thick Å | Thick Å | Var % | Cov. % | $\epsilon$ | $I_{LEAK}$ @ 3.3V A/cm$^2$ | Tan δ% |
| 1 | .290 | 9.5 | 4.5 | .197 | 100 | 104 | 22 | 2 | 400 | 80 | 750 | 800 | 780 | 20 | 50 | 245 | 3.6E-6 | 2.5 |
| 2 | .290 | 9.5 | 4.5 | .197 | 100 | 104 | 22 | 2 | 450 | 80 | 750 | 800 | 780 | 20 | 50 | 227 | 1.9E-6 | 2.3 |
| 3 | .238 | 9.5 | 4.5 | .161 | 100 | 60 | 2 | 2 | 400 | 80 | 750 | 650–750 | 520 | 0 | 75 | 305 | 3.0E-6 | 2.1 |
| 4 | .238 | 9.5 | 5.0 | .156 | 100 | 60 | 2.6 | 2 | 400 | 80 | 750 | 800–900 | 650 | N/A | 60 | 280 | 2.9E-5 | 1.7 |
| 5 | .238 | 9.5 | 5.0 | .156 | 100 | 60 | 2.6 | 2 | 400 | 80 | 800 | 800–900 | 650 | N/A | 60 | 240 | 3.0E-6 | 1.6 |
| 6 | .238 | 9.5 | 5.5 | .151 | 100 | 60 | 2.6 | 2 | 400 | 80 | 750 | 900–1000 | 650 | N/A | 50 | 259 | 1.8E-5 | 2.3 |
| 7 | .238 | 9.5 | 5.5 | .151 | 100 | 95 | 4.0 | 2 | 400 | 80 | 800 | 900–1000 | 650 | N/A | 50 | 625 | 2.2E-6 | 2.0 |
| 8 | .238 | 9.5 | 5.5 | .151 | 100 | 1170 | 4.0 | 2 | 400 | 80 | 750 | 900–1000 | 720 | N/A | N/A | 302 | 2.2E-5 | 2.1 |
| 9 | .238 | 9.5 | 5.5 | .151 | 100 | 1170 | 4.0 | 2 | 400 | 80 | 800 | 900–1000 | 720 | N/A | N/A | 322 | 1.9E-5 | 2.1 |
| 10 | .264 | 9.2 | 4.8 | .162 | 100 | 60 | 2.6 | 2 | 400 | 80 | 750 | 1220 | 650 | N/A | N/A | 256 | 7.0E-6 | 2.4 |
| 11 | .264 | 9.2 | 4.8 | .162 | 100 | 60 | 2.6 | 2 | 400 | 80 | 800 | 1220 | 650 | N/A | N/A | 291 | 1.9E-5 | 2.0 |
| 12 | .245 | 9.0 | 5.0 | .158 | 100 | 1440 | 24 | 2 | 400 | 80 | 750 | 780 | 290 | N/A | N/A | 81 | 1.1E-3 | 2.4 |
| 13 | .245 | 9.0 | 5.0 | .158 | 100 | 1440 | 24 | 2 | 400 | 80 | 800 | 780 | 290 | N/A | N/A | 88 | 8.0E-4 | 2.6 |
| 14 | .239 | 9.5 | 4.5 | .162 | 152 | 30 | 10 | 2 | 400 | 80 | 750 | 1320 | 390 | N/A | 48 | 130 | 8.0E-7 | 1.5 |
| 15 | .239 | 9.5 | 4.5 | .162 | 152 | 30 | 10 | 2 | 400 | 80 | 800 | 1320 | 390 | N/A | 48 | 193 | 3.0E-6 | 1.7 |
| 16 | .143 | 15.0 | 0 | .143 | 150 | 15 | .5 | 2 | 400 | N/A | N/A | 100–300 | N/A | N/A | N/A | N/A | N/A | N/A |
| 17 | .127 | 15 | 0 | .127 | 150 | 15 | .25 | 2 | 400 | N/A | N/A | 0 | N/A | N/A | N/A | N/A | N/A | N/A |
| 18 | .239 | 9.0 | 5.0 | .154 | 100 | 60 | 5 | 2 | 400 | N/A | N/A | 1100 | N/A | N/A | N/A | N/A | N/A | N/A |
| 19 | .239 | 9.5 | 4.5 | .162 | 100 | 60 | 5 | 2 | 400 | N/A | N/A | 780 | N/A | N/A | N/A | N/A | N/A | N/A |
| 20 | .239 | 8.5 | 5.5 | .145 | 100 | 60 | 5 | 2 | 400 | N/A | N/A | 780 | N/A | N/A | N/A | N/A | N/A | N/A |

Figure 12:
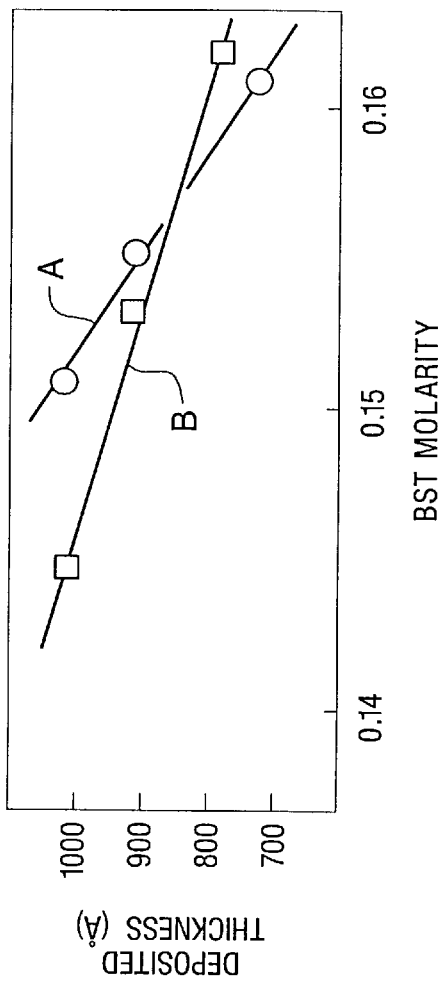

FIG. 12 is a plot of the optical (elipsometer) layer thicknesses versus BST molarity. Curve A depicts results for samples 3, 4 and 6. Curve B depicts results for samples 18, 19, and 20. FIG. 12 shows that the deposition rate measured as film thickness for a twenty minute deposition decreases with increasing BST molarity due to the reduction of methanol. The fact that deposition rate decreases with increasing molarity is opposite conventional expectations that increasing molarity should result in an increased deposition rate. The increased deposition rate with decreasing molarity is explained by Equation (1) above, and the colloidal flow physics of aerosol particles having reduced particle size diameters.

Figure 13:
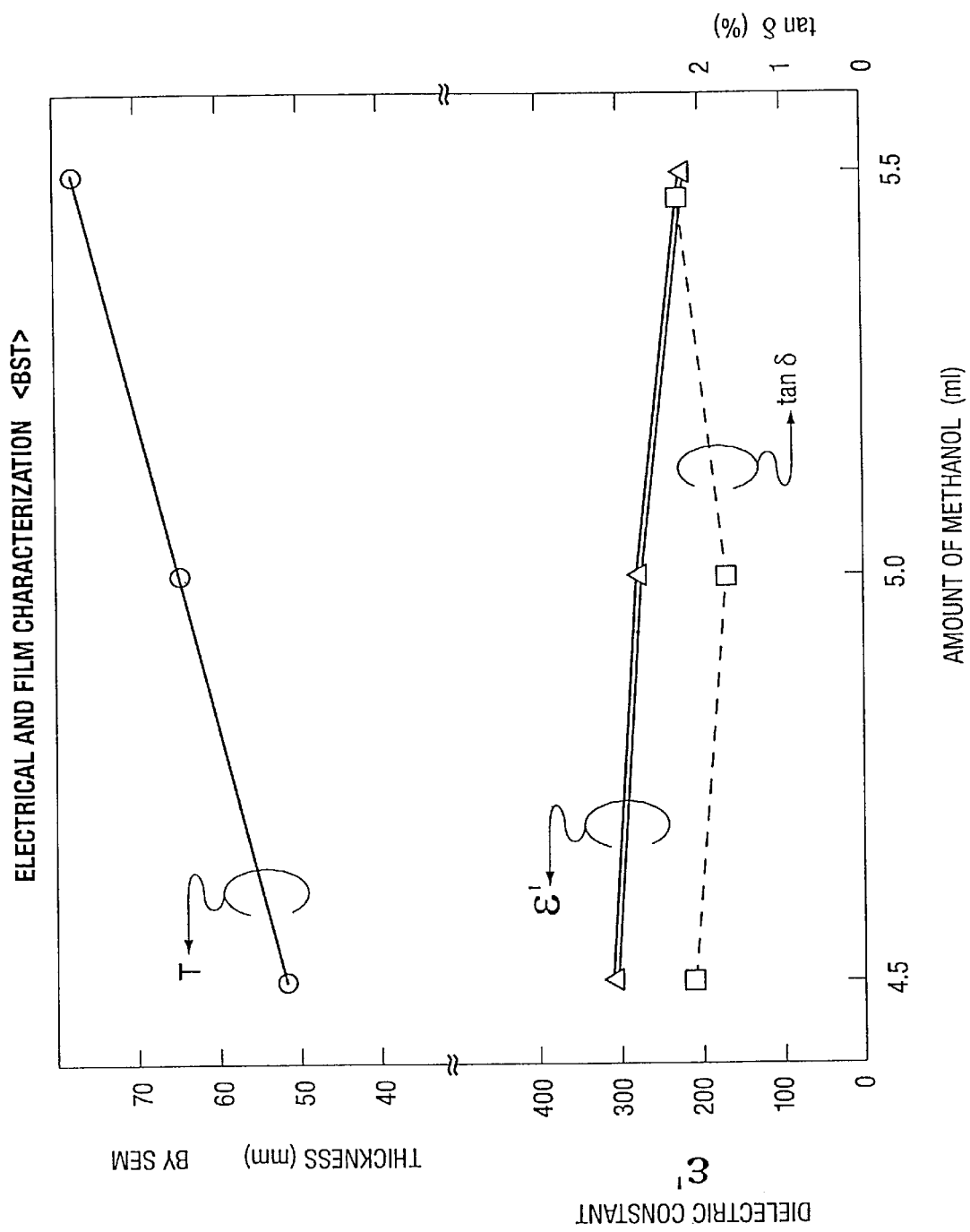

FIG. 13 is a plot of thickness, dielectric constant, and tan δ versus methanol added to 9.5 ml of the 0.239M BST solution of samples 3, 4, and 6. Thus, BST molarity decreases towards the right of FIG. 13. As before, thickness increases with decreasing molarity. Dielectric constant decreases with decreasing molarity, and tan δ decreases then increases with decreasing molarity. The decreasing dielectric constant and the variation in imaginary dielectric loss (tan δ) demonstrate that the film morphology deteriorates with the addition of methanol. Thus, the advantageous increase in film thickness is somewhat offset by a decrease in the quality of the film.

Figure 14:
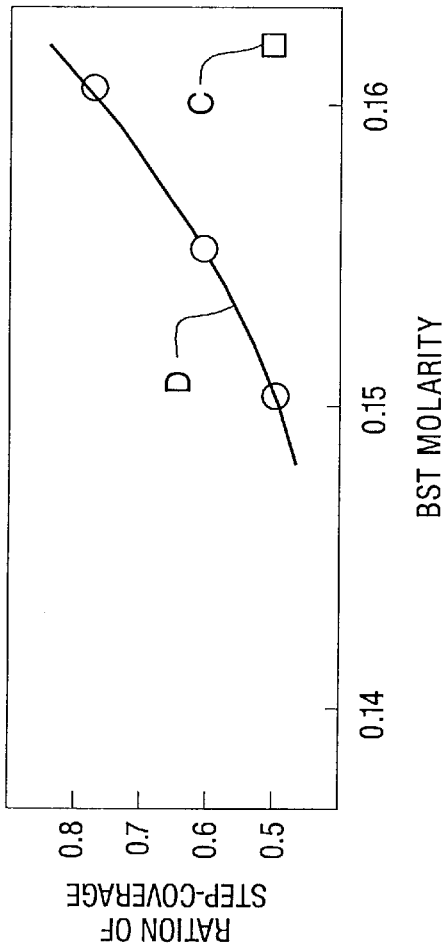

FIG. 14 is a plot of BST molarity versus the ratio of step coverage for samples 3, 4, and 6. The ratio was calculated as the layer thickness on a horizontal portion of the layer above the step divided by the layer thickness of the layer on a horizontal portion below the step. Point C represents sample 19, which was not subjected to anneal.

The invention is not limited to deposition by ultrasound-derived mists. Venturis, sprays, or other misting techniques may be used to create aerosol mists. While Equation (1) is not directly applicable to these other misting techniques, the surface tension of the precursor liquid operates according to other equations to produce colloidal particles.

The invention is advantageous in depositing complex, thin films of materials such as ferroelectrics, superconductors, materials with high dielectric constants, gems, etc., but is not limited to depositing such complex thin films. Although there has been described what is at present considered to be the preferred embodiments of the present invention, it will be understood that the invention can be embodied in other specific forms without departing from the spirit or essential characteristics thereof. The present embodiments are, therefore, to be considered in all aspects as illustrative and not restrictive. The scope of the invention is indicated by the appended claims rather than the foregoing description.

What is claimed is:

1. A liquid precursor solution for use in forming metal oxides through the use of misted deposition apparatus, said liquid precursor solution comprising:

a metal organic portion including at least one metal organic compound, said metal organic portion having a total metal content in an effective amount for yielding a solid metal compound during an anneal of a thin film of said liquid precursor solution;

a first solvent for use in solubilizing said metal organic portion; and a thinning agent for use in reducing surface tension in said liquid precursor solution to a value ranging from 10 to 40 dynes per centimeter, said metal organic portion, said first solvent, and said thinning agent forming a substantially homogenous mixture.

2. The liquid precursor solution as set forth in claim 1 wherein said value ranges from 14 to 34 dynes per centimeter.

3. The liquid precursor solution as set forth in claim 1 wherein said value ranges from 16 to 26 dynes per centimeter.

4. The liquid precursor solution as set forth in claim 1 wherein said thinning agent is selected from the group consisting of organic compounds having a boiling point greater than 64° C.

5. The liquid precursor solution as set forth in claim 1 wherein said thinning agent is selected from the group consisting of organic compounds having a viscosity less than 0.7 centipoise at 20° C.

6. The liquid precursor solution as set forth in claim 5 wherein said thinning agent is selected from the group consisting of organic compounds having a specific gravity greater than 0.7 at 20° C.

7. The liquid precursor solution as set forth in claim 1 wherein said thinning agent contains methanol.

8. The liquid precursor solution as set forth in claim 1 wherein said thinning agent is methylethylketone.

9. The liquid precursor solution as set forth in claim 1 wherein said metal compound is selected from the group consisting of perovskites and layered superlattice materials.

10. The liquid precursor solution as set forth in claim 1 wherein said effective amounts of said metal portion provide said liquid precursor solution with a molarity ranging from 0.1 to 0.2 moles per liter based upon a number of moles of said metal compound which may be derived from said liquid precursor solution.

* * * * *